(12) United States Patent
Krasner

(10) Patent No.: US 9,739,872 B2
(45) Date of Patent: Aug. 22, 2017

(54) INTERFERENCE MITIGATION FOR POSITIONING SYSTEMS

(71) Applicant: NextNav, LLC, Sunnyvale, CA (US)

(72) Inventor: Norman F. Krasner, Redwood City, CA (US)

(73) Assignee: NextNav, LLC, Sunnyvale, CA (US)

( * ) Notice: Subject to any disclaimer, the term of this patent is extended or adjusted under 35 U.S.C. 154(b) by 0 days.

(21) Appl. No.: 14/993,330

(22) Filed: Jan. 12, 2016

(65) Prior Publication Data

US 2016/0209493 A1 Jul. 21, 2016

Related U.S. Application Data

(60) Provisional application No. 62/106,198, filed on Jan. 21, 2015.

(51) Int. Cl.
| | |
|---|---|
| *H04B 1/10* | (2006.01) |
| *G01S 7/02* | (2006.01) |
| *G01S 19/21* | (2010.01) |
| *G01S 5/02* | (2010.01) |
| *H04B 1/71* | (2011.01) |
| *H04B 1/7107* | (2011.01) |
| *H04K 3/00* | (2006.01) |
| *H03H 17/02* | (2006.01) |

(52) U.S. Cl.
CPC .......... *G01S 7/023* (2013.01); *G01S 5/0215* (2013.01); *G01S 19/21* (2013.01); *H04B 1/7101* (2013.01); *H04B 1/7107* (2013.01); *H04K 3/90* (2013.01); *H03H 17/025* (2013.01)

(58) Field of Classification Search
CPC ........ G01S 7/023; G01S 19/21; G01S 5/0215; H03H 17/025; H03B 1/7101; H03B 1/7107; H03K 3/90; H03D 7/161
USPC .......................... 375/350, 229, 230, 232, 233
See application file for complete search history.

(56) References Cited

U.S. PATENT DOCUMENTS

| | | | |
|---|---|---|---|
| 4,453,132 A | 6/1984 | Stamler | |
| 6,020,783 A * | 2/2000 | Coppola | ................ H03D 7/161 327/552 |
| 6,021,156 A | 2/2000 | Wagner | |
| 2002/0170357 A1* | 11/2002 | Giordano | ......... A61B 17/32006 73/570 |

OTHER PUBLICATIONS

Form PCT/ISA/220, PCT/US2016/012962, "Notification of Transmittal of the International Search Report and the Written Opinion of the International Searching Authority, or the Declaration", 1 page(s); Form PCT/ISA/210, PCT/US2016/012962, "International Search Report", 4 page(s); Form PCT/ISA/237, PCT/US2016/012962, "Written Opinion of the International Searching Authority", 5 page(s). Date of Mailing May 17, 2016.
(Continued)

*Primary Examiner* — Phuong Phu

(57) ABSTRACT

An interference removal filter that includes a combination of a first filter and a second filter, where the first filter passes signals over a frequency range of size B with a variation of less than +/−3 dB, where the peak value of the impulse response of the second filter is displaced in time from the peak value of the impulse response of the first filter by at least 2/B time units, and where the combination of the first filter and the second filter produces a notch in frequency at a frequency location within the frequency range.

28 Claims, 10 Drawing Sheets

(Modified Notch Filter With Both Delayed and Advanced Passband Filter)

(56) References Cited

OTHER PUBLICATIONS

Jalaludeen C A: "Notch Filter Uses Only Lowpass Filters", EDN Electrical Designn News (Texas Instrument), Reed Business Information, Highlands Ranch, CO, US, vol. 42, No. 8, pp. 122 & 124, Apr. 10, 1997.

* cited by examiner (Notch Filter Impulse Response)

(Modified Notch Filter Impulse Response)

(Notch Filter)

(Modified Notch Filter With Delayed Passband Filter)

(Modified Notch Filter With Advanced Passband Filter)

(Modified Notch Filter With Both Delayed and Advanced Passband Filter)

(Correlation Amplitude, No Notch)

(Correlation Amplitude, With Notch)

(Correlation Amplitude, With Modified Notch)

(Real Part of Correlation Amplitude With Interference, No Notch)

(Real Part of Correlation Amplitude With Interference, With Notch)

(Response for One and Two Cascaded Notches)

(Frequency Response of Cascaded Notches Offset In Frequency)

(Notch Width Reduction Due to Modified Method)

(Modified Notch Frequency Response Showing Ripple)

INTERFERENCE MITIGATION FOR POSITIONING SYSTEMS

RELATED APPLICATIONS

This application relates to U.S. Patent Application Ser. No. 62/106,198, filed Jan. 21, 2015, entitled INTERFERENCE MITIGATION FOR POSITIONING SYSTEMS, the content of which is hereby incorporated by reference herein in its entirety.

FIELD

This disclosure relates to mitigating interference, and more particularly, to mitigating interference in positioning systems.

BACKGROUND

Quickly and accurately estimating the location of a thing (e.g., person, vehicle, business asset) in a geographic area can be used to speed up emergency response times, track movement, and link businesses with customers. Most approaches for estimating the location of a thing involve estimating distances between the thing and a set of remote transmitters with known locations and then using geometry to perform the position calculation. The estimated distances are often determined using positioning signals sent between the thing and the transmitters. In many geographical positioning systems, the time of arrival (TOA) of a positioning signal transmitted by a transmitter is measured with precision at a receiver, and that TOA is used to estimate the distance traveled by the positioning signal. In such systems, a time epoch or set of epochs associated with the received signal are the events used for measuring the signal's TOA. TOA positioning systems can be satellite-based, ground-based, airborne-based, or combinations thereof. Examples of such systems including the Global Positioning System (GPS), LORAN, positioning systems based upon timing signals provided by cellular telephone transmitters (e.g., in IS-801, CDMA, and others), and others.

Three main types of TOA positioning systems exist, including: (A) forward trilateration, (B) inverse trilateration, and (C) round trip timing.

In a forward trilateration system, multiple geographically dispersed transmitters send synchronized positioning signals to a receiver so the position of the receiver can be estimated. These signals are often sent concurrently so they have the same transmission time. By measuring the times of arrival of each signal, the receiver's position may be estimated by a geometrical process called trilateration. In doing so, the receiver (or another computing device that estimates the receiver's position) needs to know the positions of the transmitters, and may also need to know the transmission times of the signals, when the transmitters do not transmit the signals with a high degree of synchronization.

In an inverse trilateration system, a signal is transmitted from the unknown location, and that signal is received by geographically dispersed receiving platforms that measure the TOA's of the signal. If these receiver platforms are synchronized to one another, or if their mutual timings are somehow determined, then an estimate of the unknown position may be determined by a geometrical calculation.

In round trip timing systems, the round trip time is measured for a signal that is transmitted by one or more transmitters to a receiver to be located, and in turn retransmitted by the receiver back to the respective transmitters. The reverse is also possible where the signal initially is transmitted by a device at an unknown location, and where the signal is transmitted back to the device by a set of geographically diverse transceiving platforms. A geometrical calculation then determines an estimate of the unknown location.

One significant problem that arises in processing positioning signals from TOA positioning systems is that of multipath, which occurs when a signal from a transmitter arrives at a receiver after reflecting off different buildings and other intermediate objects between the transmitter and the receiver. In many cases, the receiver receives several nearly concurrent, or "multipath", components of the same signal, which results in a processed signal at the receiver exhibiting a series of pulses of varying amplitudes, phases, and delays that often overlap with one another. In a typical TOA positioning system, it is desirable to determine the TOA of the earliest such pulse, which usually represents a direct path component of the transmitted signal, or at least the shortest multipath component of the signal. In some cases, however, a median of the group of pulses is measured, or some other combination like the leading edge of the composite is utilized. As described later, in many TOA systems a noise-like signal is transmitted and a receiver processes such a signal (e.g., "despreads" it) in order to produce a series of pulses whose timing is more readily determined.

By way of example, FIG. 1A shows an example of a despread signal with no multipath or additive noise present. As shown, FIG. 1A depicts a large peak and very small subsidiary "sidelobes" about this peak. These sidelobes may be present due to the choice of the signal, and/or they may be due to various sources of distortion like bandlimiting filtering, nonlinearities in transceiving circuitry, and other sources. The sidelobes need not be symmetric about the largest peak.

When multipath is present, the peak of the despread signal may be distorted and, furthermore, various subsidiary peaks may occur prior to and after the largest peak. By way of example, FIG. 1B depicts a peak associated with a direct path component as a smaller bump prior to a larger peak associated with a multipath component. Of course, the smaller bump could also be associated with a non-direct multipath component and the true earliest peak may be hidden in noise. It is often the case that a peak associated with a multipath component is greater in magnitude than a peak associated with a direct path component, especially in urban environments. The correlation peaks in FIG. 1B are provided as examples only. In some cases, a peak associated with the direct path component may not be clearly discernable from a peak associated with a multipath component. Also, there are often multiple peaks prior to and after the largest peak.

In positioning systems, a receiver will typically try to determine the TOA of the earliest discernable peak, which is presumed to be associated with the shortest signal path between the receiver and transmitter. Thus, a processing system at the receiver often must determine which of the various subsidiary peaks or waveform "wiggles" prior to the largest peak represent a shorter path component of the signal. In doing so, the system must also distinguish such peaks from those that may be due to some type of system distortion. When performing multiple peak detection, a variety of powerful multipath separation algorithms are sometimes used, such as MUSIC and ESPRIT. However, various sources of system distortion may present themselves as possible earlier peaks, giving rise to errors in the determination of the earliest TOA. One such source of distortion results from signal processing procedures used to remove interfering signals at the receiver.

A problem that plagues many wireless communication systems like TOA positioning systems involves the presence of interfering signals that are observed within the receiving circuitry used by receivers. There are two broad classes of interference: (A) interfering signals due to spurious signals originating within the receiver itself, and (B) interfering signals received by the receiver from external sources. As an example of class (A) interference, various local oscillators within the receiver may provide energy that leaks into the sensitive front ends or other elements of the receiver and appears within the desired signal's received passband. Examples of class (B) interference are weak signals from nearby uncooperative emitters that are permitted within the passband of the desired received signal. Class (B) interference is especially prevalent if operation of the positioning system is within or very near to unlicensed frequency bands. Often, but not always, class (A) interference involves signals that are very narrowband and stable in frequency. In class (B) interference, the interfering signals may have either narrow or wide bandwidth, and may not be stable or predictable. For example, such interference may be FM modulated signals. Either of class (A) interference or class (B) interference, if strong enough and not mitigated, may seriously degrade the sensitivity of a positioning system, which consequentially results in reduced accuracy and may give rise to catastrophic errors.

Thus, it is desirable to remove interfering signals using signal processing methods at the receiver. In communications systems, this may be done in a variety of ways (e.g., filtering or estimation/subtraction). In many cases, the resulting performance is nearly equal to that which is possible without any interference. One primary issue, though, is a reduction in signal-to-noise ratio, which may occasionally increase error rates. In positioning systems, however, the task is not just to detect, demodulate and decode the signal-of-interest, but to precisely measure its TOA. Small distortions incurred as part of the interference mitigation procedure may result in significant decrease in positioning accuracy, particularly in multipath situations. For example, the interference mitigation procedure may produce small subsidiary peaks, or may cause a primary peak to be distorted, either of which may result in TOA estimation errors. Unfortunately, the interference mitigation task is often more difficult for TOA positioning systems.

Various techniques attempt to remove strong interference, including approaches that attempt to fully estimate the interfering signal and subtract this estimated signal from the received composite signal, which is effectively an adaptive interference removal approach. This approach may have difficulty removing the interference when the signal-to-noise ratio is not above a threshold amount or when the interference is variable in nature. One must also consider that various approaches may be complex to implement or may require a significant processing time period.

Accordingly, it is desirable to improve approaches for mitigating interference mitigation in positioning systems that avoid some or all of the limitations described above.

SUMMARY

Certain embodiments of this disclosure relate generally to systems, methods and machine-readable media for mitigating interference. Such systems, methods and machine-readable media may use a first filter network to pass signals over a frequency range of size B with a variation of less than, e.g., +/−3 dB, and may also use a second filter network to temporally displace two peak values of two impulse responses by at least 2/B time units. In at least one embodiment, the combination of the first filter network and the second filter network produces a notch in frequency at a frequency value within the frequency range.

Details of embodiments are set forth in the drawings and the description below.

BRIEF DESCRIPTION OF THE DRAWINGS

Like reference numbers and designations in the drawings indicate like elements.

DETAILED DESCRIPTION

Figure 1A:
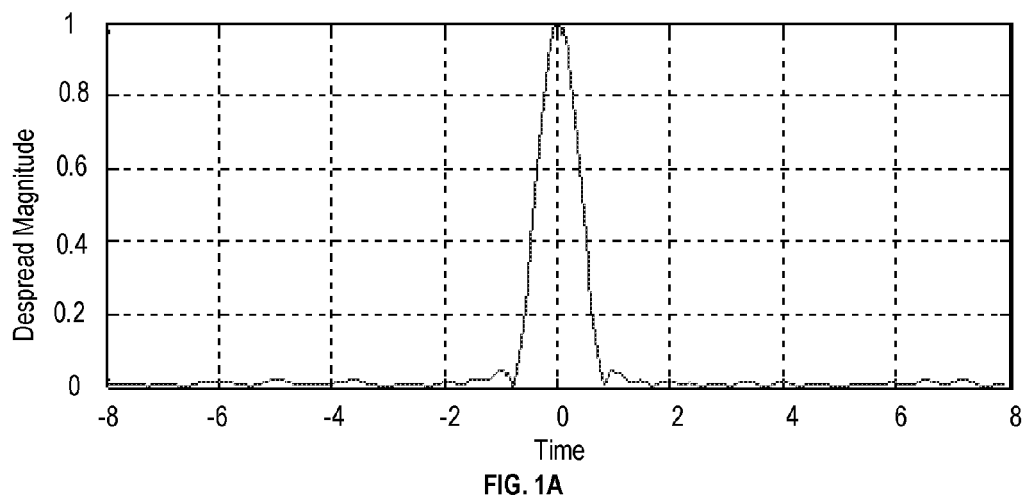
FIG. 1A depicts a correlation peak without multipath interference.
Figure 1B:
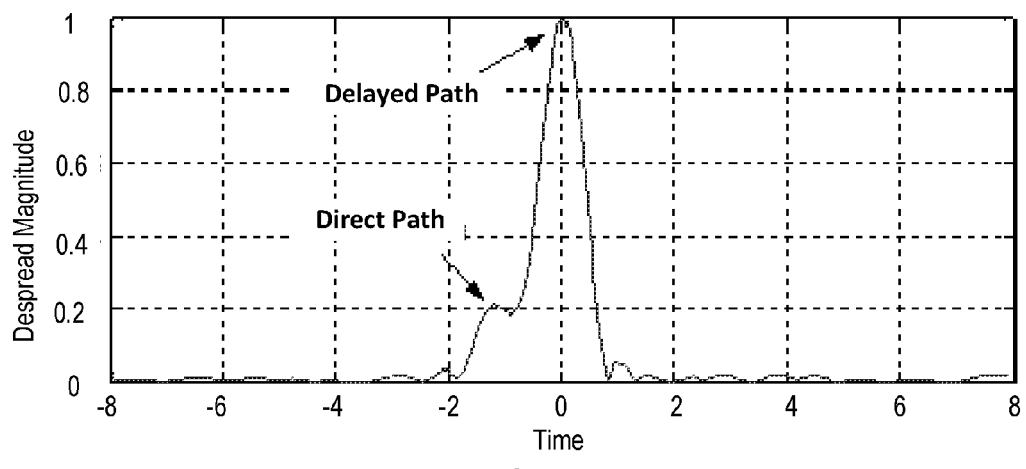
FIG. 1B depicts a correlation peak with multipath interference.

This disclosure includes several approaches for mitigating interference.

In a first approach referred to as a "modified notch filter" approach, the impulse response of a notch filter is determined. The impulse response is then divided into a leading portion of the impulse response and a trailing portion of the impulse response. A new impulse response is determined by adding a delayed (and possibly scaled) version of the trailing portion to the leading portion. The modified notch filter is then used to remove interference present in subsequently received signals.

The modified notch filter approach provides a notching operation in a frequency value that is the same as that of the original filter, and also minimizes time distortion about a correlation peak. Several variations of this approach are disclosed herein, including cascading more than one modified notched filter, and utilizing frequency translation operations together with one or more modified notched filters to improve performance This approach is relatively simple to implement, and it minimizes time distortion about the correlation peak that would often result from the use of a standard notch filter.

In a second approach referred to as a "modified reference function" approach, a mitigation filter that removes or minimizes interference is first determined A reference function is determined (or known), which is used to process received signals in the absence of interference. A modified reference function is then determined by passing the reference function through the mitigation filter. A signal that is received at a later time is passed through the mitigation filter, and the filtered signal that results along with the modified reference function are then used to determine the time of arrival (TOA) of the incoming signal.

In spread spectrum systems, the reference function may be a replica of a portion of the modulation utilized in the transmitted signal, and the processing procedure in the absence of interference involves correlation or matched filtering of the received signal and the reference. In the modified reference function approach, the received signal may be processed by the mitigation filter and subsequently correlated or matched filtered with the modified reference function.

The reference function, modified reference function, and/or mitigation filter may be realized in the time domain or the frequency domain. In some embodiments, the TOA is determined using a high resolution TOA measurement method like MUSIC, ESPRIT, LMS, or another method, along with the modified reference function. In some embodiments, the TOA is determined using a high resolution TOA measurement method which utilizes frequency domain representations of both the modified reference function and the received signal filtered by the modified reference function.

In the modified reference function approach, the time distortion associated with interference removal is not necessarily minimized Rather, the received signal may contain distortions due to the mitigation filter, but is compared to a reference that includes the same type of distortions. This approach, while often more complex and time-consuming to compute than the modified notch filter approach, can be more flexible in that it may provide better performance for wider band interference. Each of the two approaches mentioned above is described below.

Modified Notch Filter Approach

By way of example, a standard notch filter implemented in digital form has a transfer function (z-transform) that may take the following form:

$$H_n(z) = 1 - H_{nbf}(z) \quad \text{(Equation 1)},$$

where $H_{nbf}$ is a narrow bandwidth bandpass filter transfer function that is subtracted from unity to obtain the standard notch filter, and $z = \exp(j2\pi f T_s)$, wherein $f$ is frequency (e.g., in Hz) and $T_s$ is a sampling period (e.g., in seconds).

The latter term of Equation 1 is often referred to as the "bandpass filter" term. The leading unity term is often referred to as the "impulsive filter" term or "impulsive" term, and a circuit realization of the impulsive filter term is often referred to as an "impulsive network". The simplest realization of the impulsive term in Equation 1 is a direct connection like a wire in analog form.

In some cases, one may prefer to use for the bandpass filter a wideband flat passband filter that minimally affects the signal of interest, but that performs filtering to eliminate out-of-band noise or out-of-band interference. In this case, the impulsive term may have a width in the time domain (e.g., measured at a −3 dB point) of multiple samples. In an analog implementation, the simplest realization is a wire, which has an impulse response equal to an impulse. However, if a flat bandpass filter is used, the impulse response duration of such a filter would be on the order of the reciprocal of the bandwidth of the filter. Ideally, the impulsive network minimally distorts the signals that are being processed. For example, the impulsive network would generally be flat to +/−3 dB over a significant region of the signal spectrum.

In this disclosure, the terms narrow passband, narrow bandwidth, and narrowband as used to describe a bandpass filter are used interchangeably. "Narrow" refers to a passband, measured by a −3 dB bandwidth, which is small compared to the overall processing bandwidth of the signal of interest. For example, the passband may be less than 25% of overall processing bandwidth of the signal of interest. Of course, other percentages are possible depending on design choices.

In many applications of filtering tonal-type interference, the bandwidth is extremely small. In a manner similar to defining a narrow passband filter, the terms "narrowband" or "narrow bandwidth" notch are used interchangeably, and those terms refer to the bandwidth as measured by the notch being down −3 dB relative to an average level of the passband.

In some cases, the design of a notch filter may not have a transfer function explicitly in the form of Equation 1, but may be in the form of a ratio of poles and zeroes. However, it is often possible to place the transfer function in the form of Equation 1. If H(z) is an overall transfer function with unity passband gain far enough away from the notch, then $H(z)=1-(1-H(z))$, and hence $1-H(z)$ represents a narrow passband filter. This form is not accurate if the impulsive network is not ideal, but utilizes a wideband flat filter. However, it is possible to write the overall form of the notch filter as the difference in the outputs of a wideband, minimally-distorting filter and a narrow passband filter.

For example, a single pole, single zero, notch filter at frequency $f_n = \theta/2\pi T_s$ has a transfer function given by:

$$H_1(z) = 1 - \frac{\varepsilon e^{j\theta} z^{-1}}{1 - e^{j\theta}(1-\varepsilon)z^{-1}} = 1 - H_{nbf1}(z), \quad \text{(Equation 2)}$$

where $z^{-1}$ represents a delay of 1 sample, and $z^{-n}$ (if substituted for $z^{-1}$) would represent a delay of n samples).

In Equation 2, the −3 dB edges of the notch filter are $f_{3db} = +/-\varepsilon/(2\pi T_s)$ relative to the filter center frequency. For $f_n = 0$, the time domain impulse response, corresponding to Equation 2 is found via an inverse transform as:

$$h = \delta(0) - \varepsilon[\delta(1) + (1-\varepsilon)\delta(2) + (1-\varepsilon)^2\delta(3) + (1-\varepsilon)^3\delta(4) + \ldots] = \delta(0) - h_{nbf1} \quad \text{(Equation 3)},$$

where the $\delta(k)$ is a unity amplitude sample at delay k. If focus is on recursive filters, it is often more convenient to use the transfer function representation of the filter functions in Equation 2 instead of the time domain representation of the filter functions in Equation 3.

Figure 2A:
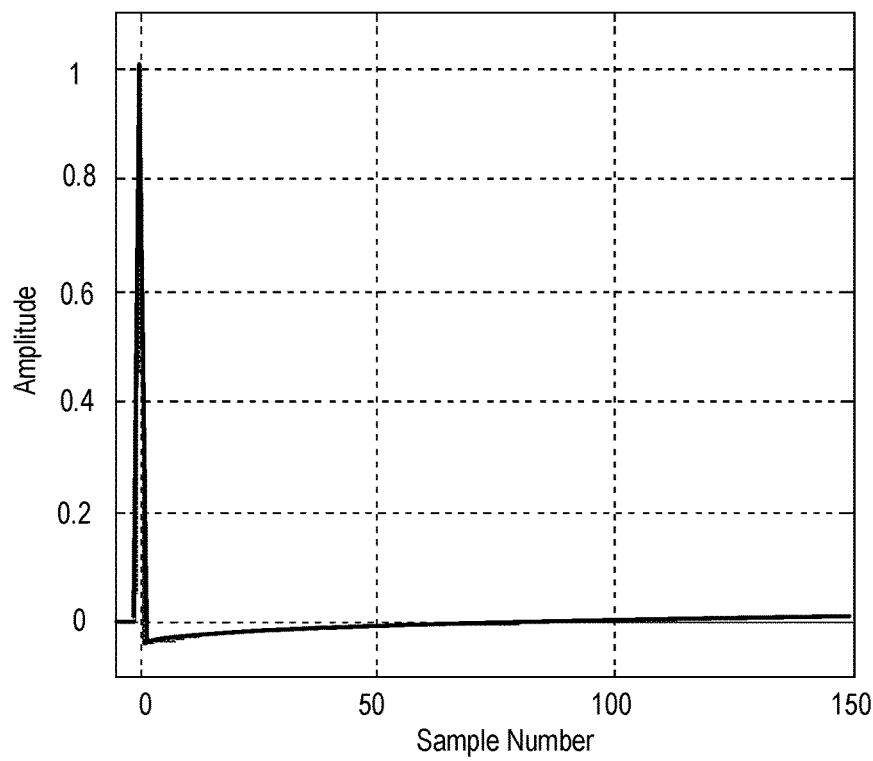
FIG. 2A depicts a standard notch filter impulse response.

By way of example of Equation 2 with $f_n = 0$, a plot of an impulse response corresponding to a transfer function is shown in FIG. 2A for a case in which the bandwidth factor $\varepsilon$ is 0.04 and the filter is centered at frequency of 0. FIG. 2A depicts a trailing portion of the impulse response following a unity value. When an input signal is passed through such a filter, a correlation peak computed following such an operation would be distorted in such a way that gives rise to errors when using algorithms associated with high resolution TOA measurement methods. This is particularly true when significant multipath is present.

To minimize this distortion, a delay may be introduced into the portion of the filter denoted as $H_{nbf1}$ in Equation 2, which yields the following modified transfer function:

$$H_2(z) = 1 - e^{jm\theta}z^{-m}\frac{\varepsilon e^{j\theta}z^{-1}}{1 - e^{j\theta}(1-\varepsilon)z^{-1}} = 1 - e^{jm\theta}z^{-m}H_{nbf1}(z). \quad \text{(Equation 4)}$$

In Equation 4, a delay of m samples via the term $z^{-m}$ has been introduced. A phase correction term $e^{jm\theta}$ also has been added because the delayed term should equal unity when $z = e^{j\theta}$ (i.e., at frequency $\theta/2\pi T_s$), but the delay term introduces a phase term $e^{-jm\theta}$ at the notch frequency. This phase correction term compensates for the phase term, and allows the overall response of Equation 4 to be unity at the notch center frequency.

Figure 2B:
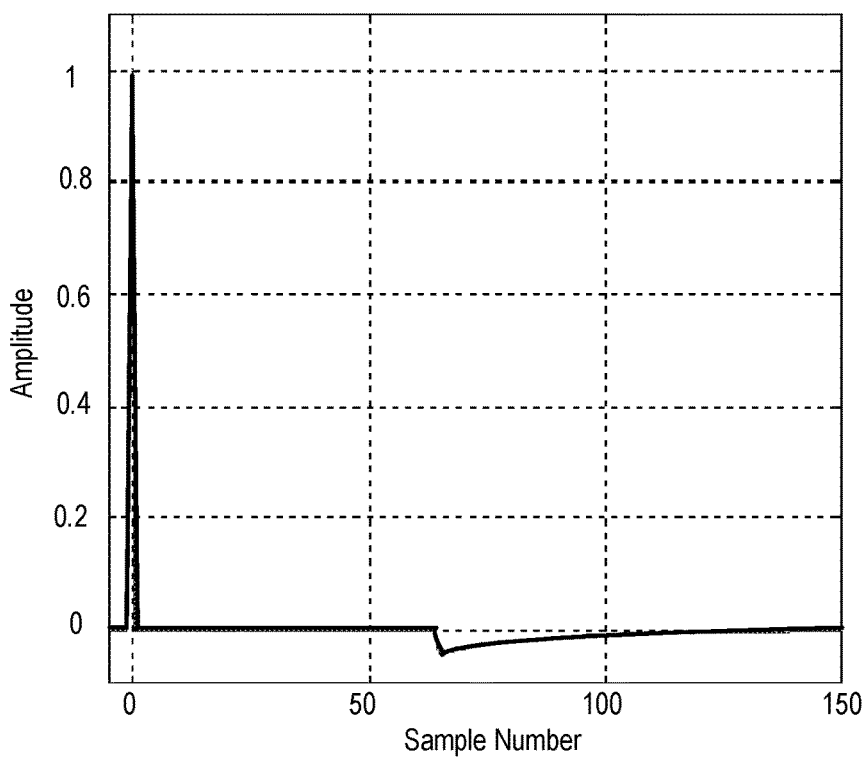
FIG. 2B depicts a modified notch filter impulse response.

A plot of the modified impulse response corresponding to Equation 4 is shown in FIG. 2B, where the delay m is set to 64 samples. As shown, the impulse response has a leading unity value but all the samples of the original impulse response after the first sample are delayed by m samples. The filter of Equation 4 still produces a notch at frequency $\theta/2\pi T_s$, and the notch bandwidth is reduced.

The notch filter represented by Equation 2 results in a disturbance near the correlation peak, which is not desirable. By comparison, when the modified notch filter represented by Equation 4 is used, the disturbance occurs at m samples after the correlation peak, which is desirable in most situations where only a small region of interest about the correlation peak is utilized for TOA processing. If the delay of m samples places the distortion beyond this region of interest, then the effects of the notch filtering are minimized The single pole filter of Equation 4 is presented as an example of a recursive infinite impulse response filter. In a more general case, the narrow passband (i.e., the narrowband filter transfer function $H_{nbf1}$ or its equivalent impulse response $h_{nbf1}$) may be representative of more complex filters which may have multiple poles and/or zeroes, and may also have a finite impulse response duration as discussed below.

Figure 3A:
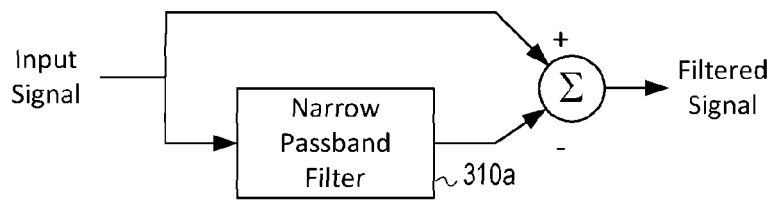
FIG. 3A depicts a first notch filter.
Figure 3B:
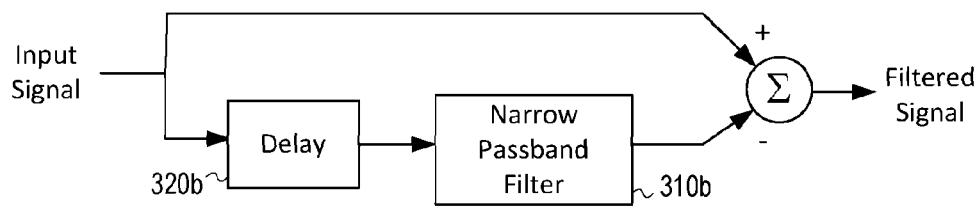
FIG. 3B depicts a second notch filter.

Comparison of a Standard Notch Filter Approach and a Modified Notch Filter Approach By way of a more general example, a block diagram of the standard notch filter, such as the one represented by Equation 2, is presented in FIG. 3A, and a block diagram of the modified notch filter, such as that represented by Equation 4, is presented in FIG. 3B. As shown, the impulsive filter term is represented as a wire at the top path, and a narrow passband filter 310a and 310b is included in the bottom path in each of FIG. 3A and FIG. 3B, respectively. FIG. 3B also includes a delay (the latter block of 320b) in the lower path.

Figure 4A:
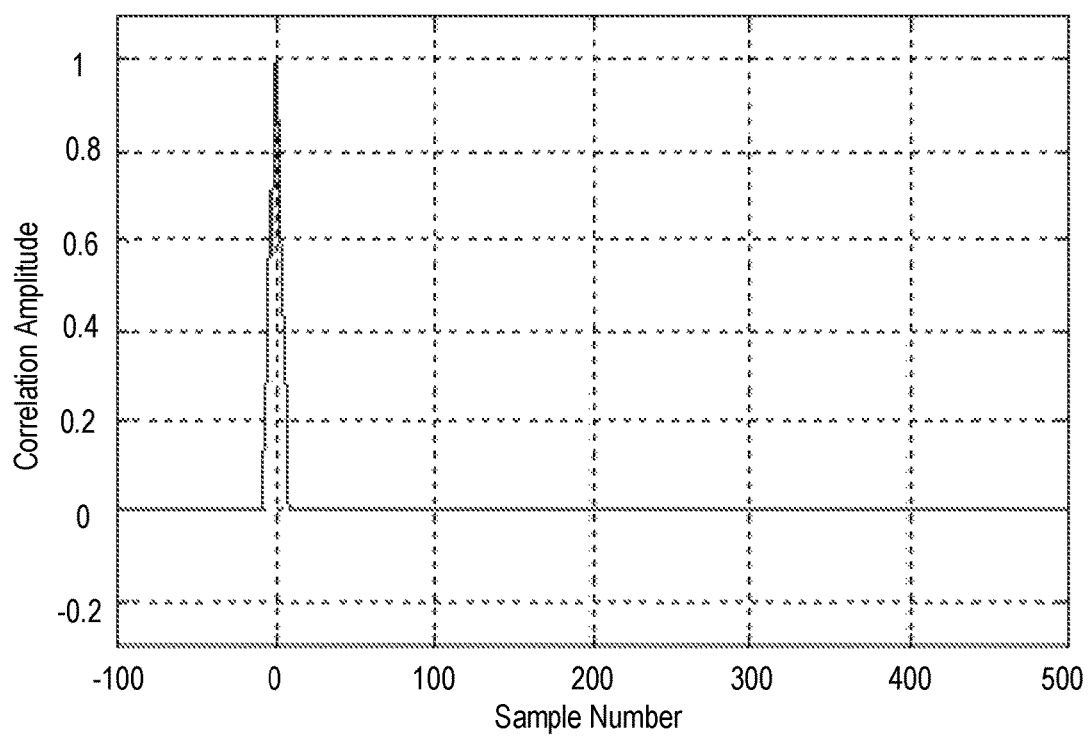
FIG. 4A depicts correlation amplitude vs. time without a notch.
Figure 4B:
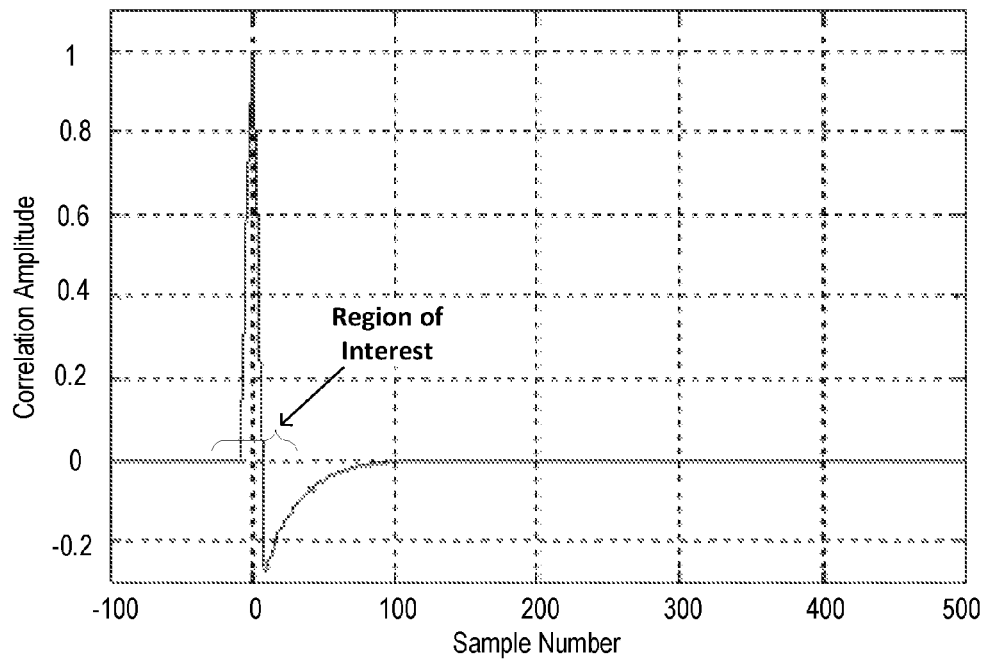
FIG. 4B depicts correlation amplitude vs. time associated with a standard notch filter.
Figure 4C:
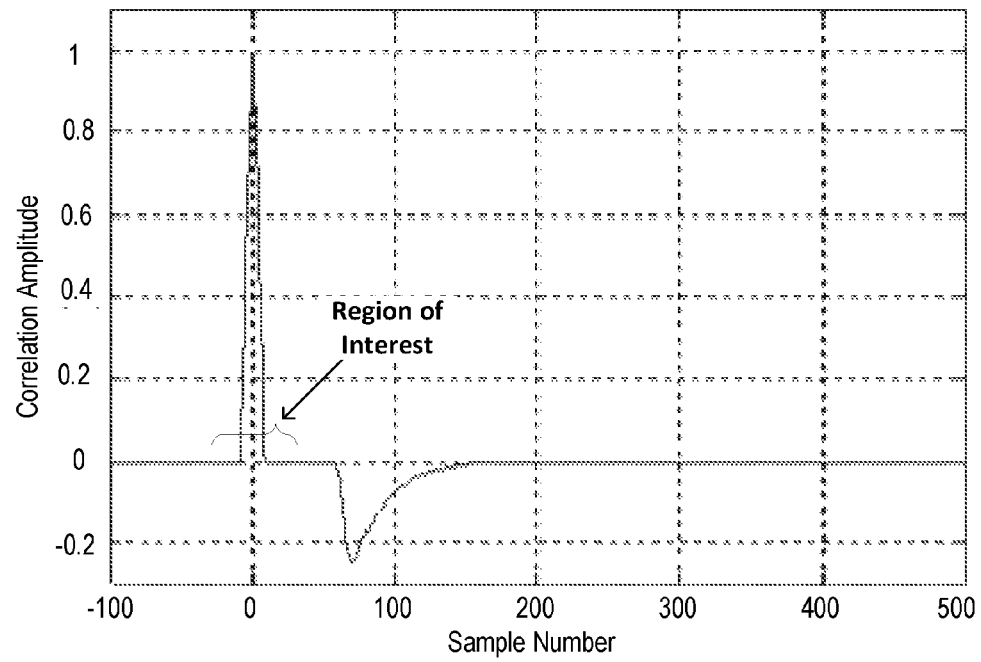
FIG. 4C depicts correlation amplitude vs. time associated with a modified notch filter.

FIG. 4A, FIG. 4B and FIG. 4C depict effects of using the filters of FIG. 3A and FIG. 3B on correlation output corresponding to an ideal pseudorandomly modulated signal, where the pseudorandom code is a maximal length code of length 1023, no interference is present, and each chip of the signal is 8 samples long. FIG. 4A shows an idealized correlation output when no notch filter is used, FIG. 4B shows correlation output when the standard notch filter of FIG. 3A is used, and FIG. 4C shows correlation output when the modified notch filter of FIG. 3B is used.

FIG. 4B, by comparison to FIG. 4A, depicts a negative distortion term that follows a correlation output. Unfortunately, the negative distortion term can give rise to errors during use of high resolution TOA algorithms and other TOA estimation algorithms that are used to process the sample region of interest shown in FIG. 4B. FIG. 4C, by comparison to FIG. 4B, depicts a position of the distortion term at many samples away from the correlation output. For many TOA positioning systems, the result shown in FIG. 4C is beneficial since the location of the distortion term is outside of the sample region of interest. By way of example, it may be known from geographical information that no multipath delay will be longer than a specified value. Thus, the positioning algorithm need not explore delays about a correlation peak exceeding this value. The delay utilized in the filter corresponding to FIG. 4C would then be chosen to exceed the maximum multipath delay.

Figure 5A:
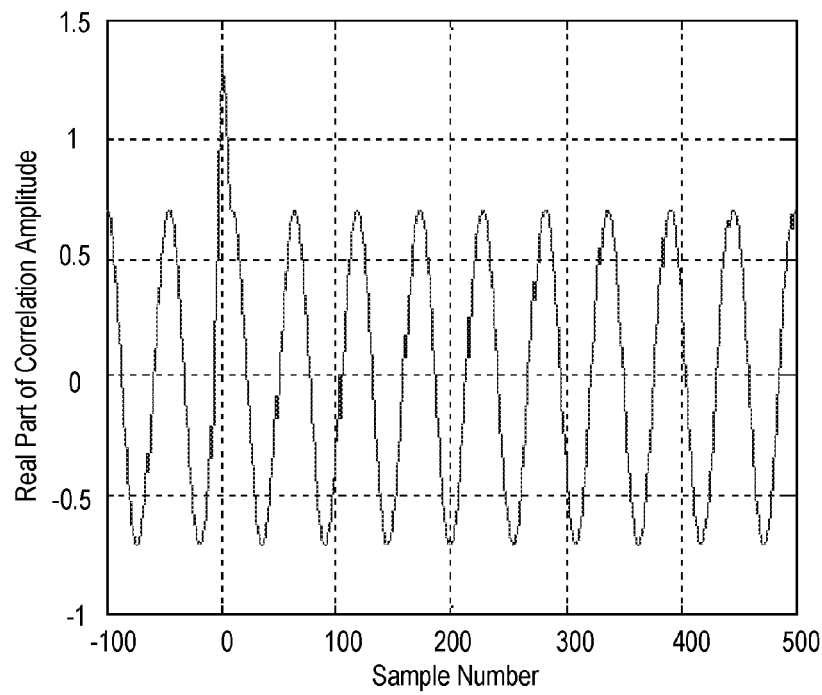
FIG. 5A depicts a real part of correlation amplitude vs. time with interference and without a notch filter.
Figure 5B:
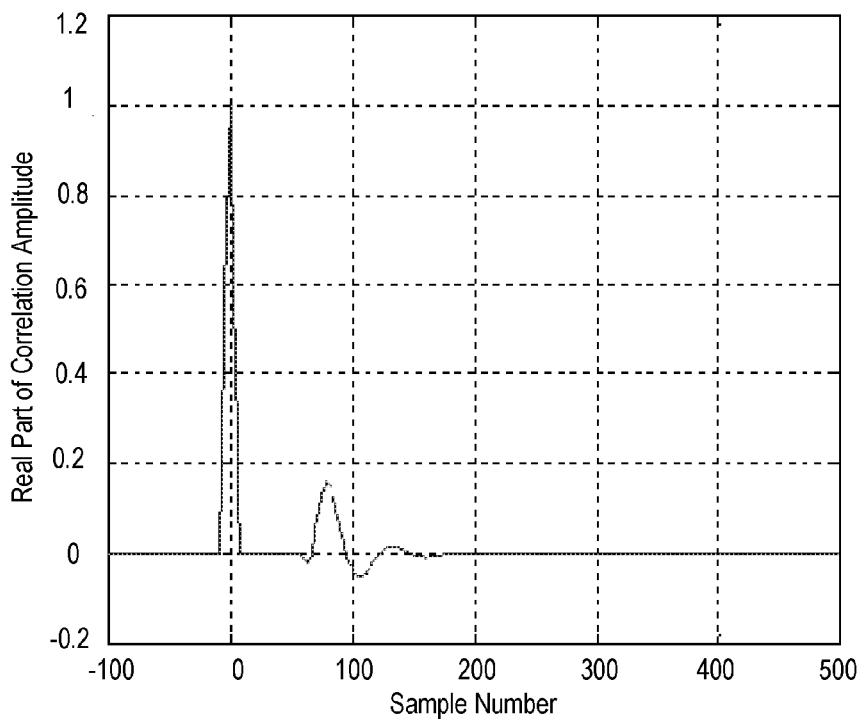
FIG. 5B depicts a real part of correlation amplitude vs. time with interference and with a notch filter.

For purposes of further illustration, FIG. 5A and FIG. 5B depict the performance of the modified notch filter when an interfering signal is present. The interfering signal is assumed to have a carrier frequency at −150 kHz relative to the desired pseudorandom signal, which is at 0 kHz. The sample rate is 8×1.023 MHz and the chip rate of the signal using a 1023 maximal length code is 1.023 MHz. The interference is assumed to be at a level −3 dB relative to the peak of the correlation function. FIG. 5A and FIG. 5B show the real part of the correlation or matched filter output, where the interference level represents an interferer whose power is 27 dB higher than the signal level prior to the correlation operation. The real part of the correlation output without notch filtering is shown in FIG. 5A, where it can be seen that the sinusoidal interfering signal almost completely hides the desired signal. In FIG. 5B, the interference has been removed by the modified notch filter leaving the small distortion term far enough away from the desired peak (in terms of a sample threshold), with a shape similar to the shape in FIG. 4C. The oscillatory nature of this distortion is due to the fact that the notch filter is now centered at −150 kHz, rather than at 0 frequency as was the case for FIG. 4C.

Variations of the Modified Notch Filter

The design of a modified notch filter represented by Equation 4 and depicted in FIG. 3B is only one possible filter design that separates a correlation peak from a distortion term. Of course, variations of that design are possible and more advantageous in different situations. Examples above for the modified notch filter depict a filter that is digital in nature (e.g., a sampled, discrete-time filter). Other possibilities include impulse responses that may be analog in nature (e.g., a continuous-time filter), in which a delay like that shown in FIG. 3B may be implemented by a continuous time delay line. It is also possible to have a mixed digital/analog filter in which the input signal is continuous in time and the filter itself is discrete, such as a tapped delay line filter, which may be implemented with surface acoustic wave (SAW) devices.

The filter examples of Equation 2 and Equation 4 depict an infinite impulse recursive (IIR) filter. One may use an alternative filter that is a finite duration filter type, which may be digital, analog, or a combination of analog and digital. In particular, a finite impulse response (FIR) digital filter would have an impulse response where the number of nonzero samples is finite.

In one embodiment, the modified notch filter may have a desired peak value surrounded by a region (called a "zonal region") of zero or very low amplitude data, where there may be sections prior to and/or after the zonal region that include other peaks that are substantial in amplitude. Most frequently, such an implementation would use FIR filters. By way of example, a modified filter transfer function may be represented as:

$$H_3(z) = z^{-M}[-0.5e^{-jm\theta}z^m H_{nbf1}(z^{-1}) + 1 - 0.5e^{jm\theta}z^{-m}H_{nbf1}(z)] \quad \text{(Equation 5)},$$

where $H_{nbf1}$ has value unity at frequency $\theta/(2\pi T_s)$, $H_{nbf1}$ has finite impulse response duration of length D, and the overall delay $z^{-M}$ is set to at least D, so that $H_3$ is realizable. The response has a notch at frequency $\theta/(2\pi T_s)$ and has a zonal region for its impulse response for m samples on either side of the unity peak value. The impulse response corresponding to Equation 5 is constructed so that the magnitude is symmetric. This is desirable in some situations, but not essential. The zonal region of +/−m samples about the primary filter peak introduces minimal distortion to a correlation peak when preceded by a matched filter with this type of structure. By way of example, a block diagram illustrating this approach is depicted in FIG. 3D, which shows three paths: a first path delayed by a first delay 320d; a second path with a narrow passband filter 315d delayed by the first delay 320d and a second delay 325d; and a third path with a narrow passband filter 310d.

Figure 3C:
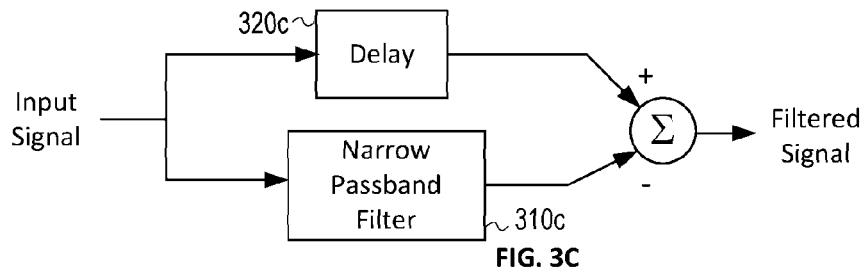
FIG. 3C depicts a third notch filter.

In another embodiment, the modified filter contains only the first two terms of Equation 5. That is, the notch filter impulse response consists of a primary peak, preceded by a filter section with a delay between the last significant samples of this section and the primary peak. That is, the zonal region precedes the largest peak (as compared to Equation 4, where the zonal region follows the largest peak). By way of example, a block diagram illustrating this approach is depicted in FIG. 3C, which shows two paths: a first delayed path with a delay 320c; and a second path with a narrow passband filter 310c. In many cases this approach is not as desirable as that of Equation 4, since even with a long delay distortion terms are produced prior to a correlation peak, and could be misinterpreted as an earlier TOA of a desired signal.

Figure 3D:
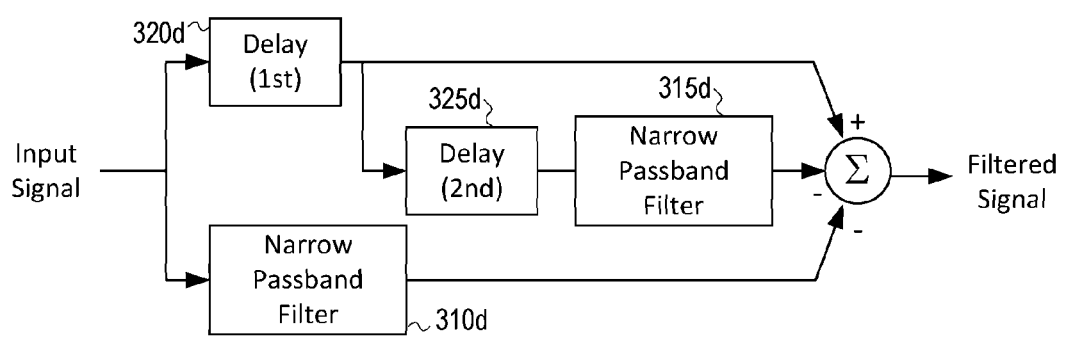
FIG. 3D depicts a fourth notch filter.

The narrow passband filter 310c of FIG. 3C and the leftmost narrow passband filter 310d of FIG. 3D have impulse responses that are preferably finite in duration to avoid producing distortion at the correlation peak. The delay 320c of FIG. 3C should preferably exceed the time at which the impulse response of the narrow passband filter is minimal in amplitude. The first delay 320d of FIG. 3D should also preferably exceed the time at which the impulse response of the leftmost narrow passband filter is minimal in amplitude.

Figure 6:
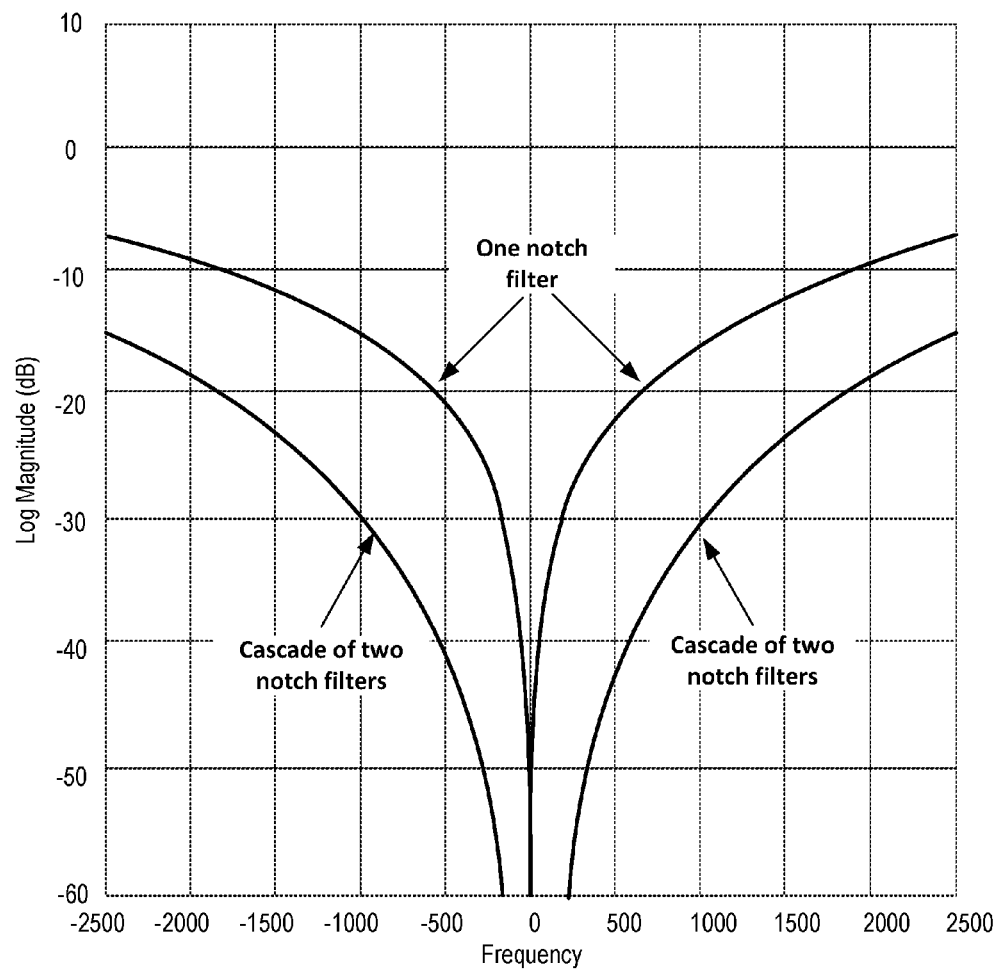
FIG. 6 depicts a frequency response for one notch filter and two cascaded notch filters.

In another variation, at least two modified filters of the type discussed above are cascaded. This approach provides increased bandwidth of the notch. The equation below illustrates such an approach:

$$H_{2c}(z) = (1 - e^{jm\theta}z^{-m}H_{nbf1}(z))(1 - e^{jm\theta}z^{-m}H_{nbf1}(z)) = \quad \text{(Equation 6)}$$
$$1 - 2e^{jm\theta}z^{-m}H_{nbf1}(z) + e^{j2m\theta}z^{-2m}H_{nbf1}(z)H_{nbf1}(z),$$

which depicts an initial impulse segment followed by a segment with a delay of m samples, and then followed by a segment with a delay of 2m samples. The cascaded filters need not be identical. For example, each may be implemented as a finite FIR or infinite (IIR) type of filter, and each may be implemented as a discrete, continuous time or hybrid type of filter. However, a cascade using two filters of the type represented by Equation 5 and illustrated by FIG. 3D will likely introduce distortion at the correlation peak, which is not as desirable as other types of cascaded filters. Such distortion is due to the cross product of the first and third segments of Equation 5, which appears on top of a central peak of the cascaded filter. By way of example, FIG. 6 shows the effects of cascading two filters that each take the form of Equation 4, where the sample rate is 8.184 MHz, and the notch 3 dB bandwidth is 25 kHz. At the −20 dB point, the notch bandwidth for the cascaded notch filters (shown as the bottom curve) is approximately 3.5 times that of the single notch filter (shown as the top curve).

Figure 7:
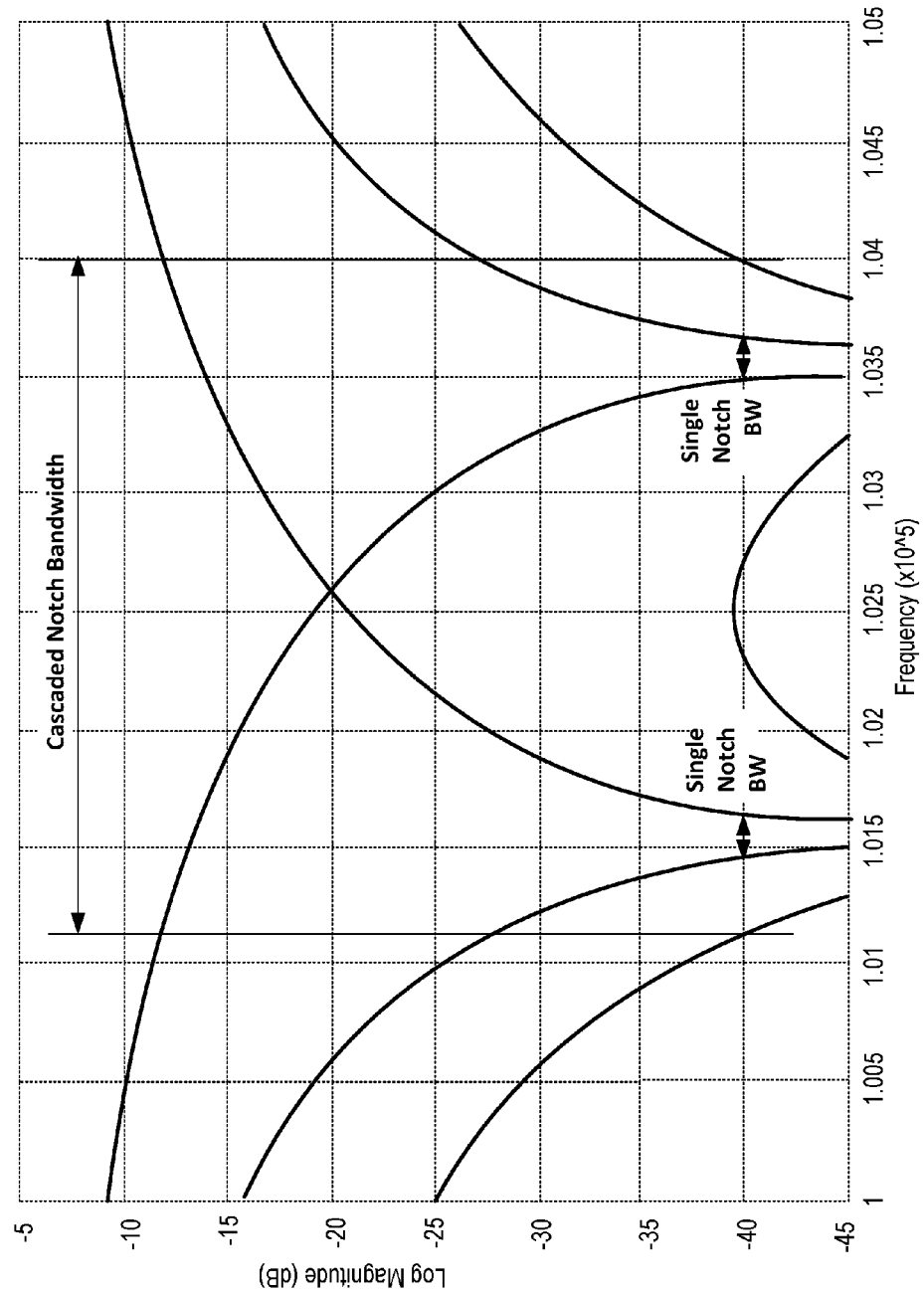
FIG. 7 depicts a frequency response for cascaded notch filters that are offset in frequency.

In another embodiment, an increased bandwidth of the notch may be obtained by cascading two or more modified notch filters, where each of the modified notch filters is displaced in frequency from one another by a small amount. As shown in FIG. 7, if one modified notch is offset in frequency such that the upper edge of a first notch overlaps the lower edge of a second notch at a −20 dB point, a wider notch can be achieved. Where individual (e.g., single pole, single zero) modified notch bandwidths are only around 200 Hz at the −40 dB point, a wider notch bandwidth of approximately 2800 Hz (approximately 14 times the single notch bandwidth) is possible. The cascading illustrated by FIG. 7 still separates distortion terms from the peak correlation at the same distance as would be the case for the individual modified notch filters.

In yet another embodiment, one modified notch filter or even a series of cascaded modified notch filters may be implemented by utilizing only notches centered at zero frequency together with frequency translation operations prior to and following such notch filters. Specifically, if it is assumed that the signal to be notched is represented in complex IQ form, a receiver may convert the signal to 0 IF by multiplying the signal by the complex sinusoid of frequency $-f_n$, the receiver may then use one or more modified notch filters as described above or elsewhere herein, and the receiver may then upconvert back to the original frequency by using a complex sinusoid of frequency $f_n$. This procedure may be employed multiple times in order to implement a set of distinct notches, or to implement a wider-band notch using two notches of slightly different frequencies, as described above. When employed multiple times, the combination of an intermediate upconversion to an original frequency followed by downconversion corresponding to a frequency to be notched may be replaced by a single frequency translation. This will reduce system complexity and improve performance.

Another embodiment involves an interference removal filter that includes a combination of: (i) a first filter that passes signals over a frequency range of size B Hz with a variation of less than +/−3 dB; and (ii) a second filter with an impulse response that has a peak value which is displaced in time from the peak value of the impulse response of the first filter by at least 2/B seconds, wherein the combination of the first filter and the second filter produces a notch in frequency at a frequency value within the frequency range. In one implementation of this embodiment, the first filter has an impulse response which is pulse-like with a pulse width on the order of 1/B. The second filter provides the displacement of a section such as $H_{nbf1}$ of Equation 1 from this impulse response, and therefore minimizes distortion about a peak of the input signal when notched by the combination of the first and second filters. The displacement of the second filter may be positive or negative. However, in one embodiment, the displacement is positive (i.e., delayed in time).

By way of example, if the frequency range is centered at 0 Hz and extends over [−F, +F], then the first filter would have a bandwidth at least B=2F, and typically would be wider. If the filter passband was flat over this range and 0 elsewhere, then the impulse response would be sinc(Bt), which is down from the peak −3.9 dB at around t=1/(2B) and has a first null at t=1/B. Hence, the second filter guarantees that there is a zonal range of at least 1/B between the location of this null and the peak of the second filter (i.e., a delay of at least 1/B). Often the first filter is somewhat wider in bandwidth than the signal of interest and hence the displacement of B is greater than 1/B.

Performance

Figure 8:
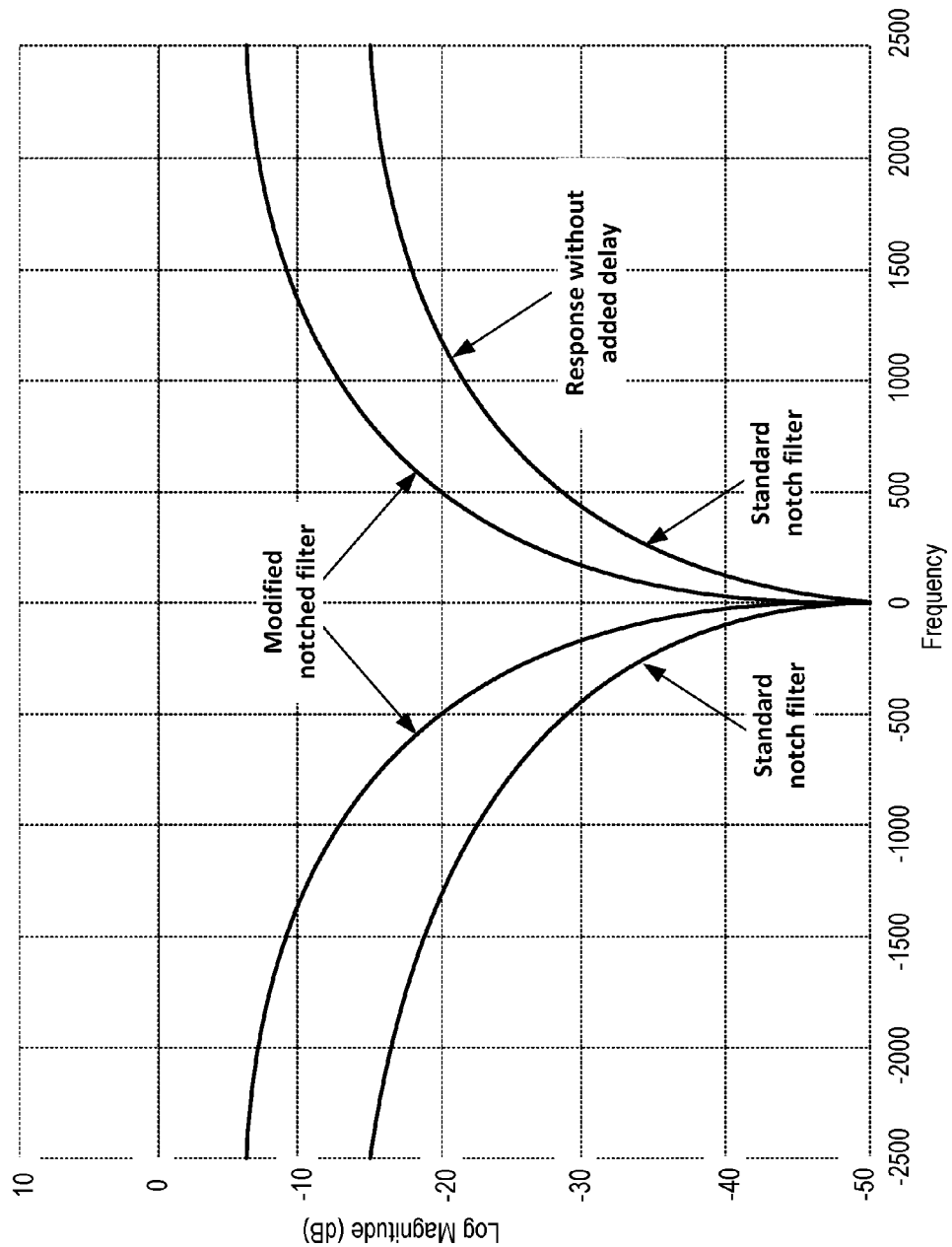
FIG. 8 depicts a notch width reduction from using a modified notch filter.

The modified notch filter approach can result in a notch that is narrower than the notch from the standard notch filter approach. This is due to the delay that separates the largest peak from the delayed segment (i.e., the term involving $H_{nbf}$). This delay introduces a rapidly changing phase vs. frequency term which causes oscillations in the transfer function. That is, the term $z^{-n}$ causes constructive and destructive interference with the leading unity term as the frequency departs from the notch frequency. For the case of a notch at zero frequency, the frequency response in the vicinity of the notch can be shown to be approximately:

$$|H_1(2\pi f/T_s) \times 2(\sin(\pi m f/T_s)| \approx 2\pi m |f|/T_s \times |H_1(2\pi f/T_s)| \quad \text{(Equation 7)},$$

where $H_1$ is the transfer function of the standard notch, such as is represented by Equation 2, and m is the delay introduced, as exemplified in Equation 4. This is illustrated in FIG. 8, which uses a single pole, single zero notch, with sample rate is 8.184 MHz, and the notch 3 dB bandwidth was chosen to be 25 kHz. In FIG. 8, the frequency response for a standard notch filter is shown as the lower curve, and the frequency response for a modified notch filter is shown as the upper curve. As shown, the modified filter has a width of around 0.4 times that of the standard notch at a −20 dB point.

If desired, the width can be adjusted by cascading two or more modified notch filters. For example, cascading two notch filters changes the functional form to:

$$4 \sin^2(\pi m f/T_s) \times |H_1^2(2\pi f/T_s)| \quad \text{(Equation 8)},$$

which is much wider (see e.g., FIG. 6). The first term, due to the delay, is typically narrower than the second, and it is often the limiting factor in bandwidth. This analysis extends to notches produced directly at other IF's and yields similar results.

Figure 9:
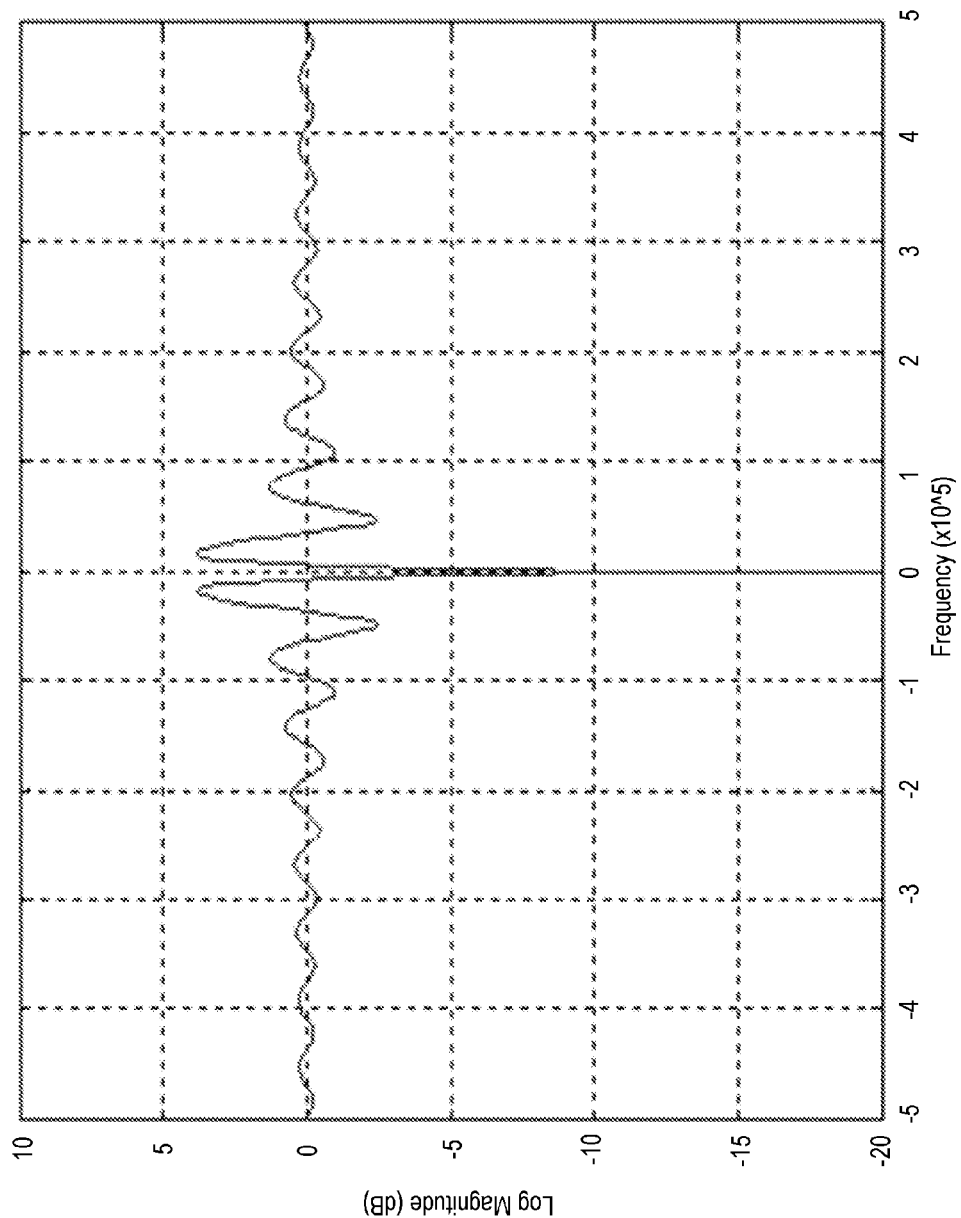
FIG. 9 depicts a modified notch frequency response showing ripple.

Another effect of the modified notch filter approach relates to an oscillatory behavior in the frequency response at the band edges of the notch filter that in turn affects the structure of the background noise, which is shown in FIG. 9. This oscillatory behavior affects the independence of the noise samples as well as the noise level estimation As indicated above, the modified notch filter preserves signal fidelity in a region about the correlation peak. In other words, the oscillatory behavior of FIG. 9 does not affect the signal in this region. However, the background noise level is often estimated based upon signal samples in this region as well as in regions well away from the correlation peak. In this case, the oscillatory behavior shown in FIG. 9 can provide errors in estimating background noise level. Since accurate noise estimation is important in some signal processing functions, such as setting false alarm rates, and also signal and noise separation procedures, additional measures may be useful for combating these noise estimation errors.

For example, it may be beneficial to estimate the noise level by using frequency data that is away from the notch location by some threshold amount, where the oscillatory behavior is more constrained.

Other Applications

Although the preferred application for modified notch filters is in processing signals in positioning systems, there are other applications in which preserving the fidelity of a correlation peak is important. This may include certain communications systems such as those using pulse position modulation, as well as certain radar and sounding systems, or other systems as would be understood by one of ordinary skill in the art.

Modified Reference Function Approach

Another method to mitigate interference is a modified reference function approach, which may be more complex and computationally expensive, but more flexible than the modified notch filter approach.

In the context of multipath scenarios, a variety of high resolution TOA measurement methods (e.g., MUSIC, ESPRIT, LMS, and others) are used in positioning systems. Often, these methods are given the reference function that is used to process the received signal in the absence of interference, which is then compared to the received signal, in order to estimate TOA. In the presence of interference, time distortions are introduced when the received signal is passed through a mitigation filter like a notch filter with a notch set at frequencies where interference is present. When this distorted received signal is given to a high resolution TOA estimation system, along with the original reference function, the TOA estimation system's comparison may produce highly erroneous estimates.

For example, consider a simple system model where a bit b (typically of value+/−1) is transmitted using the reference function p(t) over a multipath channel with an impulse response given by h(t). The received signal r(t) can be written as:

$$r(t) = bp(t) * h(t) + n(t) \quad \text{(Equation 9)},$$

where n(t) represents random noise and other distortions, and * represents a convolution operation. When no interference mitigation filtering is used, and r(t) is given to a high resolution TOA estimation system along with the original reference function p(t), the system estimates h(t) and produces an earliest TOA estimate associated with an earliest peak. In the presence of interference, when the received signal is processed with a mitigation filter m(t), the received signal $\tilde{r}(t)$ can be written as:

$$\tilde{r}(t) = m(t) * r(t) = bp(t) * m(t) * h(t) + m(t) * n(t) \quad \text{(Equation 10)}.$$

When the received signal $\tilde{r}(t)$ is given to a high resolution TOA estimation system, along with the original reference function p(t), it can be seen from Equation 10 that instead of estimating h(t), an attempt is made to estimate m(t)*h(t), which is not the true multipath channel. However, the following formulation may be used for the received signal (t) (after being passed through the mitigation filter):

$$\tilde{r}(t) = b(p(t) * m(t)) * h(t) + m(t) * n(t) = b\tilde{p}(t) * h(t) + m(t) * n(t) \quad \text{(Equation 11)}.$$

It can be seen from Equation 11 that when the received signal $\tilde{r}(t)$ is given to a high resolution TOA estimation system, along with the modified reference function $\tilde{p}(t) = m(t) * p(t)$, the received signal containing distortions from the mitigation filter is compared to a reference which itself includes the same type of distortions. This will minimize estimation errors arising due to distortions produced by interference mitigation filter. It should be noted that when p(t) is a complex waveform (such as a spread spectrum waveform discussed below), the calculation of p̃(t)=m(t)*p(t) and its incorporation into a TOA estimation system may be complex, particularly when m(t) must be varied to compensate for changing interference environments and when a multiplicity of waveforms p(t) are employed.

The simple signal model may be extended to incorporate more complex scenarios, and this approach can be used in any system for interference mitigation where signal distortions are sought to be minimized In many TOA positioning systems, transmitted signals are pulse-like in nature, or may be converted to pulses by a receiver utilizing receiving elements like matched filters, or a set of correlators. In spread spectrum TOA positioning systems, the receiver converts or "despreads" coded (or otherwise wideband modulated) received signals into a data stream that is pulse-like in nature. Such spread spectrum signals may have digital-type modulation, such as a waveform coded by a binary phase shift sequence (direct sequence), or may be more analog in character, such as a chirp (linear FM) signal. A variety of other spread spectrum waveforms exist, such as frequency hopped, quadraphase shift keyed, nonlinear FM spread signals, and others. In all such cases, however the receiver "despreads" the received waveform, producing a set of data that may be interpreted as being pulse-like in nature. The peaks of such signals are determined in the receiver's circuitry (e.g., a despreader or just a filter). The peaks may also be determined in a virtual manner by employing software in the receiver or other processor that performs processing steps analogous to that which may occur in hardware. In other cases, combinations of hardware and software perform the dispreading and peak determination operations, in a manner known in the art. This disclosure refers to such peaks as "correlation peaks" even if correlators are not employed, as may be the case of a simple transmitted pulsed-type signal. This disclosure also uses the terminology "despread signal" even if the signal type is a simple pulsed-type in which only simple filtering circuitry is used instead of correlators or matched filters. Particular examples in this disclosure apply to such spread spectrum signals that are used to estimate a position of a receiver. It is to be understood, however, that aspects of this disclosure may also apply to other situations in which a pulsed signal is transmitted and received even if that signal is not used to estimate a position of the receiver.

Other Aspects of Methods & Systems

Functionality and operation disclosed herein may be embodied as one or more methods implemented, in whole or in part, by machine(s)—e.g., processor(s), computers, or other suitable means known in the art—at one or more locations, which enhances the functionality of those machines, as well as computing devices that incorporate those machines. Non-transitory machine-readable media embodying program instructions adapted to be executed to implement the method(s) are also contemplated. Execution of the program instructions by one or more processors cause the processors to carry out the method(s). Systems (e.g., apparatuses or components thereof) operable to implement the method(s) are also contemplated.

It is noted that method steps described herein may be order independent, and can therefore be performed in an order different from that described. It is also noted that different method steps described herein can be combined to form any number of methods, as would be understood by one of skill in the art. It is further noted that any two or more steps described herein may be performed at the same time. Any method step or feature disclosed herein may be expressly restricted from a claim for various reasons like achieving reduced manufacturing costs, lower power consumption, and increased processing efficiency.

By way of example, not by way of limitation, method(s), system(s) or other means may use or include: a combination of a first filter and a second filter, wherein the first filter passes or is operable to pass signals over a frequency range of size B with a variation of less than +/−3 dB, wherein the peak value of the impulse response of the first filter and the peak value of the impulse response of the second filter are displaced in time from one another by at least 2/B time units, and wherein the combination of the first filter and the second filter produces or is operable to produce a notch in frequency at a frequency value within the frequency range. In one embodiment, the time units are seconds.

In one embodiment, the peak value of the impulse response of the second filter is displaced in time from the peak value of the impulse response of the first filter such that peak value of the impulse response of the second filter occurs after the peak value of the impulse response of the first filter.

In one embodiment, the interference removal filter is digitally implemented, wherein the impulse response of the first filter consists of a nonzero sample, wherein the second filter is a recursive filter following a delay line of at least 4 samples, and wherein the combination of the first filter and the second filter is a subtraction operation.

Method(s), system(s) or other means may further or alternatively use or include: a third filter, wherein the peak of the impulse response of the third filter and the peak value of the impulse response of the first filter are displaced in time from one another by at least 2/B time units, and wherein the combination of the first filter, the second filter, and the third filter produces or is operable to produce a notch in frequency at a frequency value within the frequency range.

Method(s), system(s) or other means may further or alternatively use or include: a combination of a third filter and a fourth filter, wherein the third filter passes or is operable to pass signals over the frequency range of size B with the variation of less than +/−3 dB, wherein the peak value of the impulse response of the third filter and the peak value of the impulse response of the fourth filter are displaced in time by at least 2/B time units, wherein the combination of the third filter and the fourth filter produces or is operable to produce another notch in frequency at another frequency value within the frequency range, and wherein the combination of the third filter and the fourth filter is in cascade with the combination of the first filter and the second filter.

In one embodiment, the frequency value of the notch produced by the combination of the first filter and the second filter and the other frequency value of the other notch produced by the combination of the third filter and the fourth filter are the same.

In one embodiment, the frequency value of the notch produced by the combination of the first filter and the second filter and the other frequency value of the other notch produced by the combination of the third filter and the fourth filter are different.

In one embodiment, the interference removal filter is a digital filter. In one embodiment, the interference removal filter is an analog filter. In one embodiment, the interference removal filter is a hybrid analog-and-digital filter.

In one embodiment, the second filter is a finite impulse response digital filter. In one embodiment, the second filter is an infinite impulse response digital filter.

In one embodiment, the first filter comprises a gain stage without any filtering. In one embodiment, the gain stage has unity gain.

Method(s), system(s) or other means may further or alternatively use or include: a delay component.

In one embodiment, the interference removal filter further comprises: a first frequency translator that alters or is operable to alter a carrier frequency for each of the signals from an initial value to a first value before the signals are passed through the combination of the first and second filters; and a second frequency translator that alters or is operable to alter the carrier frequency for each of the signals to a second value after the signals are passed through the combination of the first and second filters.

In one embodiment the first frequency translator alters or is operable to alter the carrier frequency for each of the signals to the first value so that the notch frequency is at a prescribed frequency value. For example, the notch frequency may be centered at 0 Hz or another specific value. Alternatively, the notch frequency may be substantially at 0 Hz or the other specific value (e.g., where substantially is +/−20% of the notch bandwidth).

In one embodiment, the initial value and the second value are the same.

In one embodiment, the first frequency translator alters or is operable to alter the carrier frequency for each of the signals to the first value so that the notch frequency corresponds to the frequency of at least one undesired signal.

At least one method for removing interference comprises: passing, through a first filter, a signal such that the variation of the signal produced by this first filter over a frequency range of size B is less than +/−3 dB; and passing through a second filter said signal, wherein, the passing of the signal through the first and second filters results in a notch being produced in the signal's spectrum at a frequency value within the frequency range, and wherein the peak value of the impulse response of the first filter and the peak value of the impulse response of a second filter are displaced in time from one another by at least 2/B time units.

In one embodiment, the peak value of the impulse response of the second filter is displaced in time from the peak value of the impulse response of the first filter such that the peak value of the impulse response of the second filter occurs after the peak value of the impulse response of the first filter.

In one embodiment, the first and second filters are digitally implemented, wherein the impulse response of the first filter consists of a nonzero sample, wherein the second filter is a recursive filter following a delay line of at least 4 samples, and wherein the combination of the first filter and the second filter is a subtraction operation.

In one embodiment, the method comprises: passing the signal through a third filter such that the passing of the signal through the first, second, and third filters results in a notch being produced in the signal's spectrum at a frequency value within the frequency range, wherein the peak value of the impulse response of the first filter and the peak value of the impulse response of the third filter are displaced in time from one another by at least 2/B time units.

In one embodiment, the method comprises: passing the signal through a third filter and a fourth filter such that the passing of the signal through the third filter and fourth filter results in another notch being produced in the signal's spectrum at a frequency value within the frequency range, wherein the peak value of the impulse response of the third filter and the peak value of the impulse response of the fourth filter are displaced in time from one another by at least 2/B time units, and wherein the combination of the third filter and the fourth filter is in cascade with the combination of the first filter and the second filter.

In one embodiment, the frequency value of the notch produced by the combination of the first filter and the second filter and the other frequency value of the other notch produced by the combination of the third filter and the fourth filter are the same.

In one embodiment, the frequency value of the notch produced by the combination of the first filter and the second filter and the other frequency value of the other notch produced by the combination of the third filter and the fourth filter are different.

In one embodiment, the combination of the first and second filters is a digital filter. In one embodiment, the combination of the first and second filters is an analog filter. In one embodiment, the combination of the first and second filters is a hybrid analog-and-digital filter. In one embodiment, the second filter is a finite impulse response digital filter. In one embodiment, the second filter is an infinite impulse response digital filter. In one embodiment, the first filter comprises a gain stage without any filtering. In one embodiment, the gain stage has unity gain. In one embodiment, the time units are seconds.

In one embodiment, an initial carrier frequency of the signals is altered to a first frequency prior to passing the signals to the first and second filters; and, after the signals pass through the first and second filters, the carrier frequency of the signals is altered to a second frequency. In one embodiment, the carrier frequency is altered to the first frequency so that the notch frequency is centered at 0 Hz. In one embodiment, the second frequency is the initial frequency.

In one embodiment, the method further comprises: altering a carrier frequency of the signal from an initial value to a first value prior to passing the signal to the first and second filters; and altering a carrier frequency of the signal to a second value after the signal passes through the first and second filters. In one embodiment, the carrier frequency of the signal is altered to the first value so that the notch frequency is at the prescribed frequency. In one embodiment, the initial value and the second value are the same. In one embodiment, the first frequency translator alters the carrier frequency for each of the signals to the first value so that the notch frequency corresponds to the frequency of at least one undesired signal.

An output from one system may cause another system to perform a method even if intervening steps occur between the output and performance of the method.

A "receiver" may be in the form of a computing device (e.g., a mobile phone, a tablet, a PDA, a laptop, a digital camera, a tracking tag). A receiver may also take the form of any component of the computer, including a processor.

Processing by the receiver can also occur at a server.

The illustrative methods described herein may be implemented, performed, or otherwise controlled by suitable hardware known or later-developed by one of skill in the art, or by firmware or software executed by processor(s), or any combination of hardware, software and firmware. Software may be downloadable and non-downloadable at a particular system. Such software, once loaded on a machine, changes the operation of that machine.

Systems on which methods described herein are performed may include one or more means that implement those methods. For example, such means may include processor(s) or other hardware that, when executing instructions (e.g., embodied in software or firmware), perform any method step disclosed herein. A processor may include, or be included within, a computer or computing device, a controller, an integrated circuit, a "chip", a system on a chip, a server, other programmable logic devices, other circuitry, or any combination thereof.

"Memory" may be accessible by a machine (e.g., a processor), such that the machine can read/write information from/to the memory. Memory may be integral with or separate from the machine. Memory may include a non-transitory machine-readable medium having machine-readable program code (e.g., instructions) embodied therein that is adapted to be executed to implement any or all of the methods and method steps disclosed herein. Memory may include any available storage media, including removable, non-removable, volatile, and non-volatile media—e.g., integrated circuit media, magnetic storage media, optical storage media, or any other computer data storage media. As used herein, machine-readable media includes all forms of machine-readable media except to the extent that such media is deemed to be non-statutory (e.g., transitory propagating signals).

All of the information disclosed herein may be represented by data, and that data may be transmitted over any communication pathway using any protocol, stored on data source(s), and processed by a processor. Transmission of data may be carried out using a variety of wires, cables, radio signals and infrared light beams, and an even greater variety of connectors, plugs and protocols even if not shown or explicitly described. Systems may exchange information with each other using any communication technology. Data, instructions, commands, information, signals, bits, symbols, and chips and the like may be represented by voltages, currents, electromagnetic waves, magnetic fields or particles, or optical fields or particles.

Features in system figures that are illustrated as rectangles may refer to hardware, firmware or software. It is noted that lines linking two such features may be illustrative of data transfer between those features. Such transfer may occur directly between those features or through intermediate features. Where no line connects two features, transfer of data between those features is contemplated unless otherwise stated.

The words comprise, comprising, include, including and the like are to be construed in an inclusive sense (i.e., not limited to) as opposed to an exclusive sense (i.e., consisting only of). Words using the singular or plural number also include the plural or singular number, respectively. The word or and the word and, as used in the Detailed Description, cover any of the items and all of the items in a list. The words some, any and at least one refer to one or more. The term may is used herein to indicate an example, not a requirement—e.g., a thing that may perform an operation or may have a characteristic need not perform that operation or have that characteristic in each embodiment, but that thing performs that operation or has that characteristic in at least one embodiment.

The invention claimed is:

1. An interference removal filter comprising:
a first filter implemented in hardware and operable to pass signals over a frequency range of size B with a variation of less than +/−3 dB;
a second filter implemented in hardware and operable to pass the signals over a frequency range that is less than 25% of the size B;
a delay positioned before the first filter or the second filter to displace a peak value of an impulse response of the first filter and a peak value of an impulse response of the second filter in time from one another by at least 2/B time units.

2. The interference removal filter of claim 1, wherein the delay is positioned before the second filter such that the peak value of the impulse response of the second filter occurs after the peak value of the impulse response of the first filter.

3. The interference removal filter of claim 1, wherein the interference removal filter includes a subtraction operation performed on outputs of the first filter and the second filter.

4. The interference removal filter of claim 1, wherein the delay is positioned before the first filter such that the peak value of the impulse response of the first filter occurs after the peak value of the impulse response of the second filter.

5. The interference removal filter of claim 4, wherein the interference removal filter further comprises:
a third filter implemented in hardware,
another delay implemented in hardware and positioned before the third filter to displace the peak value of the impulse response of the first filter and a peak value of an impulse response of the third filter in time from one another by at least 2/B time units.

6. The interference removal filter of claim 1, wherein the interference removal filter further comprises:
a third filter implemented in hardware and operable to pass the signals over the frequency range of size B with the variation of less than +/−3 dB;
a fourth filter implemented in hardware and operable to pass the signals over the frequency range that is less than 25% of the size B; and
another delay implemented in hardware and positioned before the third filter or the fourth filter to displace a peak value of an impulse response of the third filter and a peak value of an impulse response of the fourth filter in time from one another by at least 2/B time units,
wherein the third filter and the fourth filter are in cascade with the first filter and the second filter.

7. The interference removal filter of claim 1, wherein the second filter is a finite impulse response analog filter.

8. The interference removal filter of claim 1, wherein the impulse response of the first filter consists of a nonzero sample, and wherein the second filter is a recursive filter following a delay line of at least 4 samples.

9. The interference removal filter of claim 1, wherein the first filter comprises a gain stage without any filtering, wherein the gain stage has unity gain.

10. The interference removal filter of claim 1, wherein the first filter and the second filter combine to produce a notch in frequency at a frequency value within the frequency range, and wherein the interference removal filter further comprises:
a first frequency translator operable to alter the carrier frequency of the signals from an initial value to a first value before the signals are passed through the first filter and the second filter; and
a second frequency translator operable to alter the carrier frequency of the signals to a second value after the signals are passed through the first filter and the second filter,
wherein the first frequency translator is operable to alter the carrier frequency for each of the signals to the first value so that the notch frequency corresponds to the frequency of at least one undesired signal or so that the notch frequency is at a prescribed frequency.

11. A computer-implemented method for removing interference, the computer-implemented method comprising:
passing, through a first filter, a signal such that the variation of the signal produced by the first filter over a frequency range of size B is less than +/−3 dB; and
passing the signal through a second filter over a frequency range that is less than 25% of the size B,
delaying the signal before it passes through the first filter or before it passes through the second filter to displace a peak value of an impulse response of the first filter and a peak value of an impulse response of the second filter in time from one another by at least 2/B time units.

12. The method of claim 11, wherein delaying the signal before it passes through the first filter or before it passes through the second filter comprises:
delaying the signal before it passes through the second filter such that the peak value of the impulse response of the second filter occurs after the peak value of the impulse response of the first filter.

13. The method of claim 11, wherein the method further comprises:
performing a subtraction operation on outputs of the first filter and the second filter.

14. The method of claim 11, wherein delaying the signal before it passes through the first filter or before it passes through the second filter comprises:
delaying the signal before it passes through the first filter such that the peak value of the impulse response of the first filter occurs after the peak value of the impulse response of the second filter.

15. The method of claim 14, wherein the method further comprises:
delaying the signal before it passes through a third filter to displace the peak value of the impulse response of the first filter and a peak value of an impulse response of the third filter in time from one another by at least 2/B time units.

16. The method of claim 11, wherein the method further comprises:
passing the signal through a third filter such that the variation of the signal produced by the third filter over the frequency range of size B is less than +/−3 dB;
passing the signal through a fourth filter over the frequency range that is less than 25% of the size B; and
delaying the signal before it passes through the third filter or before it passes through the fourth filter to displace a peak value of an impulse response of the third filter and a peak value of an impulse response of the fourth filter in time from one another by at least 2/B time units.

17. The method of claim 11, wherein the impulse response of the first filter consists of a nonzero sample, and wherein the second filter is a recursive filter following a delay of at least 4 samples.

18. The method of claim 11, wherein the first filter comprises a gain stage without any filtering, wherein the gain stage has unity gain.

19. The method of claim 11, wherein the first filter and the second filter combine to produce a notch in frequency at a frequency value within the frequency range, and wherein the method further comprises:
altering the carrier frequency of the signal from an initial value to a first value prior to passing the signal to the first and second filters; and
altering the carrier frequency of the signal to a second value after the signal passes through the first and second filters.

20. One or more non-transitory machine-readable media embodying program instructions that, when executed by one or more machines, cause the one or more machines to implement a method for removing interference, the method comprising:
passing, through a first filter, a signal such that the variation of the signal produced by the first filter over a frequency range of size B is less than +/−3 dB; and
passing the signal through a second filter over a frequency range that is less than 25% of the size B,
delaying the signal before it passes through the first filter or before it passes through the second filter to displace a peak value of an impulse response of the first filter and a peak value of an impulse response of the second filter in time from one another by at least 2/B time units.

21. The one or more non-transitory machine-readable media of claim 20, wherein delaying the signal before it passes through the first filter or before it passes through the second filter comprises: delaying the signal before it passes through the second filter such that a peak value of the impulse response of the second filter occurs after the peak value of the impulse response of the first filter.

22. The one or more non-transitory machine-readable media of claim 20, wherein the method further comprises: performing a subtraction operation on outputs of the first filter and the second filter.

23. The one or more non-transitory machine-readable media of claim 20, wherein delaying the signal before it passes through the first filter or before it passes through the second filter comprises: delaying the signal before it passes through the first filter such that the peak value of the impulse response of the first filter occurs after the peak value of the impulse response of the second filter.

24. The one or more non-transitory machine-readable media of claim 23, wherein the method further comprises:
delaying the signal before it passes through a third filter to displace the peak value of the impulse response of the first filter and a peak value of an impulse response of the third filter in time from one another by at least 2/B 3 time units.

25. The one or more non-transitory machine-readable media of claim 20, wherein the method further comprises:
passing the signal through a third filter such that the variation of the signal produced by the third filter over the frequency range of size B is less than +/−3 dB;
passing the signal through a fourth filter over the frequency range that is less than 25% of the size B; and
delaying the signal before it passes through the third filter or before it passes through the fourth filter to displace a peak value of an impulse response of the third filter and a peak value of an impulse response of the fourth filter in time from one another by at least 2/B time units,
wherein the passing of the signal through the third and fourth filters is subsequent to the passing of the signal through the first and second filters.

26. The one or more non-transitory machine-readable media of claim 20, wherein the impulse response of the first filter consists of a nonzero sample, and wherein the second filter is a recursive filter following a delay of at least 4 samples.

27. The one or more non-transitory machine-readable media of claim 20, wherein the first filter comprises a gain stage without any filtering, wherein the gain stage has unity gain.

28. The one or more non-transitory machine-readable media of claim 20, wherein the first filter and the second filter combine to produce a notch in frequency at a frequency value within the frequency range, and wherein the method further comprises:
- altering the carrier frequency of the signal from an initial value to a first value prior to passing the signal to the first and second filters; and
- altering the carrier frequency of the signal to a second value after the signal passes through the first and second filters.

* * * * *